United States Patent
Liu et al.

(10) Patent No.: US 11,239,635 B2
(45) Date of Patent: Feb. 1, 2022

(54) MEMS/NEMS INTEGRATED BROKEN RACETRACK TUNABLE LASER DIODE

(71) Applicant: Telefonaktiebolaget LM Ericsson (publ), Stockholm (SE)

(72) Inventors: Neng Liu, Montreal (CA); Robert Brunner, Montreal (CA); Stephane Lessard, Mirabel (CA)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 0 days.

(21) Appl. No.: 17/268,535

(22) PCT Filed: Aug. 16, 2018

(86) PCT No.: PCT/IB2018/056196
§ 371 (c)(1),
(2) Date: Feb. 15, 2021

(87) PCT Pub. No.: WO2020/035719
PCT Pub. Date: Feb. 20, 2020

(65) Prior Publication Data
US 2021/0239906 A1    Aug. 5, 2021

(51) Int. Cl.
*G02B 6/12* (2006.01)
*H01S 5/14* (2006.01)
(Continued)

(52) U.S. Cl.
CPC .......... *H01S 5/142* (2013.01); *G02B 6/12007* (2013.01); *G02B 6/12033* (2013.01);
(Continued)

(58) Field of Classification Search
None
See application file for complete search history.

(56) References Cited

U.S. PATENT DOCUMENTS 5,175,521 A * 12/1992 Larson ................ H01P 1/20336
                                                                 333/221
7,773,642 B2     8/2010 Yamazaki
(Continued)

FOREIGN PATENT DOCUMENTS

EP             3113303 A1     1/2017
JP       2015-135386 A *      7/2015

OTHER PUBLICATIONS

T. Ikeda et al. A tunable notch filter using microelectromechanical microring with gap-variable busline coupler. Optics Express, 21: 19:22034-22042, Sep. 11, 2013. (Year: 2013).*
(Continued)

*Primary Examiner* — Michael Stahl
(74) *Attorney, Agent, or Firm* — Murphy, Bilak & Homiller, PLLC (57) ABSTRACT

According to an aspect, an optical system includes a laser diode configured to emit optical signals and at least two size-switchable broken racetrack ring resonators optically coupled to an optical waveguide, where each broken racetrack ring resonator is configured to exhibit a resonant wavelength. The optical system also includes a tuning arrangement associated with the broken racetrack ring resonators, where the tuning arrangement includes a micro electro-mechanical system (MEMS) or nano electro-mechanical system (NEMS) actuator mechanically coupled to a first portion of a first one of the broken racetrack ring resonators and configured to mechanically move the first portion so as to change the resonant wavelength of the first one of the broken racetrack ring resonators.

16 Claims, 8 Drawing Sheets

(51) Int. Cl.
  *G02B 6/42* (2006.01)
  *H01S 5/026* (2006.01)
(52) U.S. Cl.
  CPC .......... *G02B 6/4202* (2013.01); *H01S 5/0264* (2013.01); *H01S 5/147* (2013.01); *G02B 2006/12121* (2013.01)

(56) References Cited

U.S. PATENT DOCUMENTS

| | | | |
|---|---|---|---|
| 7,962,045 | B2 | 6/2011 | Mccallion et al. |
| 8,032,027 | B2 | 10/2011 | Popovic |
| 8,891,922 | B2 | 11/2014 | Krug et al. |
| 9,608,406 | B1* | 3/2017 | Lee ................. H01S 5/06255 |
| 9,748,726 | B1 | 8/2017 | Morton et al. |
| 2007/0110453 | A1* | 5/2007 | Akiyama ............. H04B 10/504 398/182 |
| 2009/0046748 | A1 | 2/2009 | Kato |
| 2012/0189025 | A1* | 7/2012 | Zheng ................. H01S 5/1071 372/20 |
| 2016/0049767 | A1* | 2/2016 | Morton ................. H01S 5/142 372/20 |
| 2016/0156149 | A1* | 6/2016 | Takabayashi ......... H01S 5/142 372/6 |
| 2018/0026426 | A1 | 1/2018 | Kawakita et al. |
| 2018/0306976 | A1* | 10/2018 | Mir Shafiei .......... G02B 6/3502 |

OTHER PUBLICATIONS

Abdulla, S.M.C., et al., "Tuning a racetrack ring resonator by an integrated dielectric MEMS cantilever", Optics Express vol. 19, No. 17, Aug. 15, 2011, 1-15.

Alavi S. E., et al., "Towards 5G: A Photonic Based Millimeter Wave Signal Generation for Applying in 5G Access Fronthaul", Scientific Reports, vol. 6, Jan. 2016, 1-11.

Chollet, Frank, "Devices Based on Co-Integrated MEMS Actuators and Optical Waveguide: A Review", Micromachines, vol. 7, Issue 2, MDPI, Jan. 2016, 1-33.

Chu, Hoang Manh, et al., "A Wide-Tuning Silicon Ring-Resonator Composed of Coupled Freestanding Waveguides", IEEE Photonics Technology Letters, vol. 26, No. 14, Jul. 15, 2014, 1411-1413.

Du, Han, "Mechanically-Tunable Photonic Devices with On-Chip Integrated MEMS/NEMS Actuators", Micromachines, vol. 7, Issue 4, MDPI, Apr. 2016, 1-24.

Hah, Dooyoung, "C-band optical filters with micromechanical tuning", Microsystem Technologies, Berlin, Germany, vol. 24, No. 1, Oct. 13, 2017, 1-10.

Komljenovic, Tin, et al., "Heterogeneous Silicon Photonic Integrated Circuits", Journal of Lightwave Technology, vol. 34, No. 1, IEEE, Jan. 1, 2016, 20-35.

Komljenovic, Tin , et al., "Widely-Tunable Ring-Resonator Semiconductor Lasers", Applied Sciences, vol. 7, Issue 7, MDPI, Jul. 2017, 1-21.

Liu, A. Q., et al., "A review of MEMS external-cavity tunable lasers", Journal of Micromechanics and Microengineering, vol. 17, Issue 1, Institute of Physics Publishing, Jan. 2007, 1-13.

Mirshafiei, Mehrdad, et al., "A Silicon Photonic Broken Racetrack Resonator for Large-Scale Tuning of FSR", IEEE Photonics Technology Letters, vol. 28, No. 5, Mar. 1, 2016, 565-568.

Pham, Phuc Hong, et al., "A micro transmission system based on SOI-MEMS technology: improvement and characteristics". Microsystem Technologies, vol. 23, Springer, Jun. 16, 2016, 3237-3243.

Poon, Joyce K. S., et al., "Wavelength-Selective Reflector Based on a Circular Array of Coupled Microring Resonators", IEEE Photonics Technology Letters, vol. 16, No. 5, May 2004, 1331-1333.

* cited by examiner

MEMS/NEMS INTEGRATED BROKEN RACETRACK TUNABLE LASER DIODE

TECHNICAL FIELD

The present invention is related to silicon photonics and particularly related to using micro electro-mechanical systems (MEMS) or nano electro-mechanical system (NEMS) for tuning laser diode wavelength ranges.

BACKGROUND

Laser diodes that have tunable wavelength ranges can promote various communication applications, including wavelength-division multiplexing (WDM) and millimeter wave signal generation in wireless communication systems. Tunable laser diodes can also be used for sensing applications, including light detection and range detection in self-driving cars.

There are two common mechanisms for tuning the wavelength of laser diode resonators on a silicon photonics platform. One mechanism is thermal-based and the other is carrier-based (carrier injection or depletion). These two mechanisms modify the resonator waveguide effective index. Thermal tuning is limited due to its low speed tuning (10 s of kHz) and narrow tunability. On a silicon waveguide, the wavelength tuning rate is ~0.08 nm/° C. at 1550 nm, which requires an increase of temperature to 700° C. to get a tuning range of 60 nm. Such a high temperature would have negative effects on laser diode performance. On the other hand, laser diode absorption loss increases during carrier injection tuning. The absorption loss for high-speed modulation can be relieved with carrier depletion tuning.

The resonator cavity is an important element in a laser diode, and various internal and external resonator cavities have been developed, from simple Fabry-Perot mirrors to grating resonators, ring resonators and photonic crystal structures. Among these, two common resonator cavities are the Bragg grating resonator and the ring resonator. The ring resonator has several advantages over the grating resonator, including a large side-mode suppression ratio, a narrow linewidth, reduced frequency chirp and a wide continuing tunability. In contrast to the grating resonator structure, the ring resonator can be fabricated in a single step. Also, because the effective light path of a ring resonator is significantly enhanced, the propagation loss is reduced with a smaller linewidth. Narrow linewidth is an important performance characteristic of a ring resonator laser diode, because it is important for coherent communication. Multiple ring resonators (MRR) or coupled ring resonators (CRR) have been suggested to have superior linewidth, but their development is limited by a complicated process that involves independently heat tuning the individual rings.

Silicon is an indirect bandgap material and cannot emit light. Therefore, an external gain (lighting) material is needed in laser diode circuits. Recent integration of gain material includes strained germanium on silicon, directly hybrid or heterogenous integrated and grown gain material (e.g., III-V semiconductor) and other lasing microstructures on the silicon platform. Besides these lasing materials, other non-silicon materials (e.g., carbon-based material, like carbon nanotube and graphene) and other organic materials have been successfully integrated onto a silicon substrate. Different lasing materials have helped to reduce light coupling losses and package costs, but further improvements are necessary.

Micro electro-mechanical systems (MEMS) or nano electro-mechanical system (NEMS) photonics bridge independent research and engineering fields, like mechanics, photonics, electronics and physics/chemistry. Various new MEMS and NEMS devices have been developed for optical communication, including micro-mechanical optical switches, optical filters and optical sensors.

SUMMARY

Laser diodes are tunable by thermal tuning or carrier tuning, so the tunable range, speed and stability of these laser diodes are limited by thermal problems and material electrical properties. Compared with conventional thermal or carrier tuning, mechanical tuning can be more efficient and consume less power. However, mechanically tunable laser diodes can have problems with chip scale integration and light coupling. For example, MEMS tunable laser diodes can use mechanically tunable external grating/mirror filters or movable vertical multi-dielectric layer cavities with a tuning range of 7.92 THz. While laser diodes can have micromachined movable reflectors, including mirrors. Fabry-Perot cavities and gratings, these devices can have problems with mode hopping, packaging and coupling to other silicon photonics devices.

Embodiments of the present invention provide a laser diode that is tunable with one or more size-switchable broken racetrack ring resonators that are moved by MEMS or NEMS actuators. A racetrack ring resonator has a higher coupling efficiency than a circular ring resonator and may work as a reflector and/or a filter. Also, different materials may be integrated on selective areas of a silicon platform to optimize performance of the laser diodes. Thermal or electrical carrier tuning can still be applied to these laser diodes, in addition to the mechanical tuning, to further improve laser diode function.

Advantages of using MEMS/NEMS actuators with broken racetrack ring resonators include accelerated wavelength switching speeds, where integration of advanced MEMS/NEMS actuators is good for future high capacity optical and wireless telecommunications. Replacing thermal and carrier tuning parts with MEMS/NEMS actuators also relieves thermal and instability problems present in current laser diodes. Some optical systems can enlarge the wavelength tunable range of laser diodes by integrating slightly different circumference MEMS/NEMS broken racetrack ring resonators to utilize the Vernier effect.

Other advantages include reduced costs for microfabrication and for any updates to the telecommunication system, as the size of a racetrack ring is switchable after micro/nanofabrication and packaging of the laser diode. Advantages also include a more compact laser diode microstructure with 2D/3D hybrid or heterogeneous integrated gain materials and lasing structure on a silicon platform. Coupling loss that occurs with an external laser diode can be minimalized by being microfabricated on a silicon platform and by using a silicon waveguide in the laser diode's microstructures.

According to some embodiments, an optical system includes a laser diode configured to emit optical signals and at least two size-switchable broken racetrack ring resonators optically coupled to an optical waveguide, where each broken racetrack ring resonator is configured to exhibit a resonant wavelength. The optical system also includes a tuning arrangement associated with the broken racetrack ring resonators, where the tuning arrangement includes a MEMS or NEMS actuator mechanically coupled to a first portion of a first one of the broken racetrack ring resonators and configured to mechanically move the first portion so as to change the resonant wavelength of the first one of the broken racetrack ring resonators.

Of course, the present invention is not limited to the above features and advantages. Indeed, those skilled in the art will recognize additional features and advantages upon reading the following detailed description, and upon viewing the accompanying drawings.

DETAILED DESCRIPTION

Figure 1:
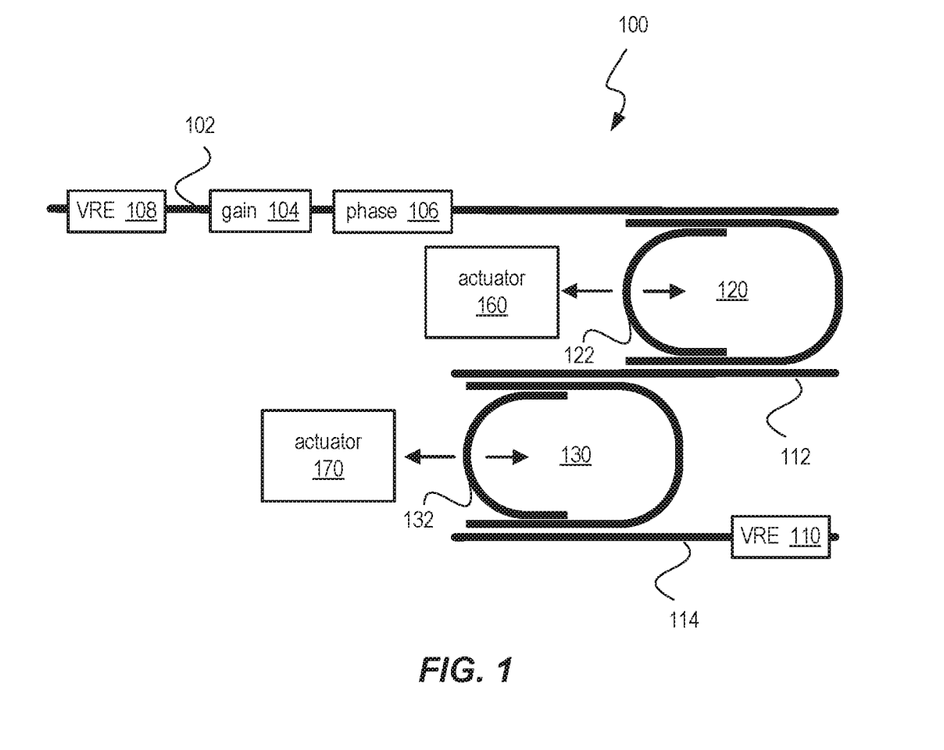
FIG. 1 illustrates a laser diode with MEMS/NEMS broken racetrack ring resonators on a single side, according to some embodiments.

Replacing thermal and carrier tuning parts with MEMS/NEMS actuators relieves thermal and instability problems present in current laser diodes. In an example, FIG. 1 shows a laser diode 100 with broken racetrack rings 120, 130 on a single side that are tunable by actuators 160, 170 of a tuning arrangement. Using MEMS/NEMS actuators with broken racetrack ring resonators accelerates wavelength switching speeds, benefitting high-capacity optical and wireless telecommunications.

Figure 2:
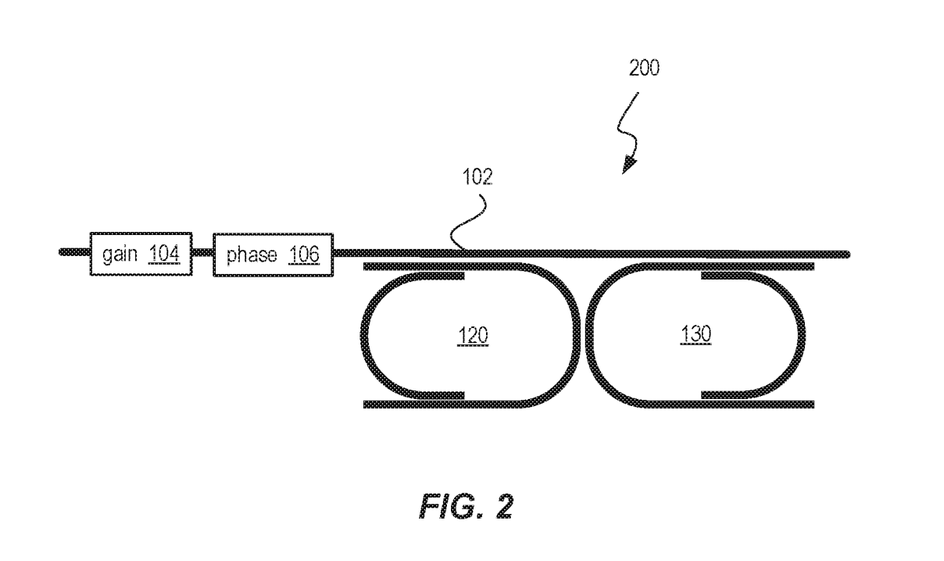
FIG. 2 illustrates another laser diode with MEMS/NEMS broken racetrack ring resonators on a single side, according to some embodiments.
Figure 3:
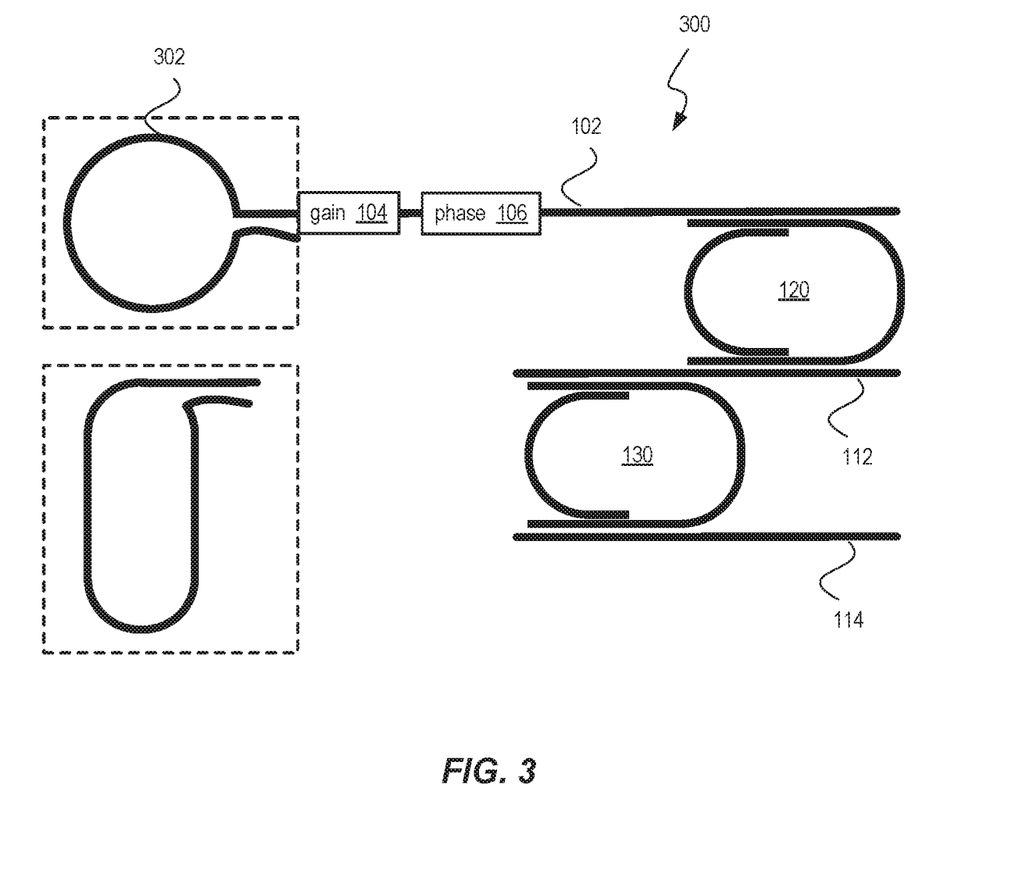
FIG. 3 illustrates another laser diode with MEMS/NEMS broken racetrack ring resonators on a single side, according to some embodiments.

FIGS. 1-3 show, according to some embodiments, schematics of laser diodes 100, 200, 300 with MEMS/NEMS-integrated broken racetrack ring resonators 120, 130 on a single side of a gain 104 and phase 106 section. The gain and phase sections 104, 106 are placed at an optical waveguide 102 between reflectors and/or mirrors. Light may be transmitted and reflected in appropriate directions on optical waveguides 102, 112 and 114, depending on the design. In the examples, the gain region 104 is made from active materials (e.g., III-V materials, germanium) heterogenous or hybrid integrated onto a silicon substrate by standard methods, like wafer bonding or regrowth. Both butt coupling and direct vertical coupling techniques (e.g., adiabatic coupling, photonic crystal coupling, or via) can be used to transport light from a bonded gain region 104 to the silicon photonics platform. The phase section 106 in the cavity can be used for a slight detuning of the laser oscillation depending on the minimum cavity loss condition (resonator resonance) for best linewidth performance. Variable reflective elements (VREs) 108, 110 are able to transmit light in one direction and reflect light in the reverse direction in controlled proportions (0-100%). VREs are inclusive of Sagnac rings, coupled ring resonator reflectors and reflective coated waveguides/lenses/mirrors. In the three designs of FIGS. 1-3, the broken racetrack ring resonators 120, 130 are mechanically tunable.

The optical system shown by FIG. 1 includes a laser diode 100 configured to emit optical signals and at least two size-switchable broken racetrack ring resonators 120, 130, optically coupled to an optical waveguide 102. Each broken racetrack ring resonator 120, 130 is configured to exhibit a resonant wavelength. The optical system also includes a tuning arrangement associated with broken racetrack ring resonators 120, 130, where the tuning arrangement includes a MEMS or NEMS actuator 160 mechanically coupled to a first portion 122 of a first one 120 of the broken racetrack ring resonators 120, 130 and configured to mechanically move first portion 122 so as to change the resonant wavelength of the first one 120 of the broken racetrack ring resonators 120, 130. For convenience, broken racetrack ring resonators may be referred to as simply racetrack rings for brevity in the rest of this description.

Racetrack rings 120 and 130 in FIG. 1 may have different circumferences (e.g., where ring 130 is slightly larger) and work as a wavelength filter. Based on the Vernier effect, filtered resonant light from these racetrack rings 120, 130 interact with each other in bus waveguide 112 to produce a laser diode with a greatly amplified FSR. The circumferences of these racetrack rings 120, 130 are switchable by moving half the arm of a racetrack ring waveguide with mechanical actuators. For example, movable portion 122 of racetrack ring 120 and movable portion 132 of racetrack ring 130 may be moved by actuators 160 and 170, respectively. The tuning arrangement can directly move portion 122 of the racetrack ring 120 or move portion 122 of racetrack ring 120 through a micro cantilever or a nano cantilever. Moving portion 122 of racetrack ring 120 introduces a resonance wavelength difference between racetrack rings 120, 130.

An important parameter in the racetrack ring is free spectra resonance (FSR), the distance between different resonance wavelengths from a lasing spectrum comb. One effective method to increase a tunable range for laser diodes is to use two or more coupled racetrack rings with slightly different circumferences, which work as a filter and a reflector in laser diodes. For example, due to the Vernier effect, the FSR of a combined two racetrack ring resonator is amplified by $(L1/(L1-L2))$, where L1 and L2 are the lengths of these two different racetrack rings. As the circumference difference is small, the FSR improvement can be great. According to some embodiments, the tuning arrangement is configured to use actuator 160 to adjust a circumference of race track ring 120. Accordingly, each broken racetrack ring resonator 120, 130 may have a circular periphery with a different circumference, and the broken racetrack ring resonators 120, 130 and the tuning arrangement are thus configured to mechanically tune the optical system so as to enlarge the wavelength tunable range based on the Vernier effect.

During microfabrication, these racetrack rings 120, 130 can optically couple to each other or couple to other ring structures, straight waveguides, and other optical elements in the laser diode structures in both lateral and vertical directions. Different optical system arrangements are shown in the figures.

Racetrack rings 120, 130 can optically couple to each other using a series add-drop with a bus waveguide 112 as a single wavelength filter. Also, as shown in FIG. 2, the two racetrack rings (120, 130) for laser diode 200 can directly couple to each other, which works as both a wavelength filter and a mirror. In some embodiments, besides facet reflective mirror coating, various mirror structures can be integrated into a laser diode, such as a Sagnac mirror 302, using a circular loop or a racetrack loop, as shown for the laser diode 300 in FIG. 3. An optional photodiode (PD) can also been monolithically integrated on the same chip, which will be used to monitor the emission light then tuning the optical circuits in a feedback loop.

Figure 4:
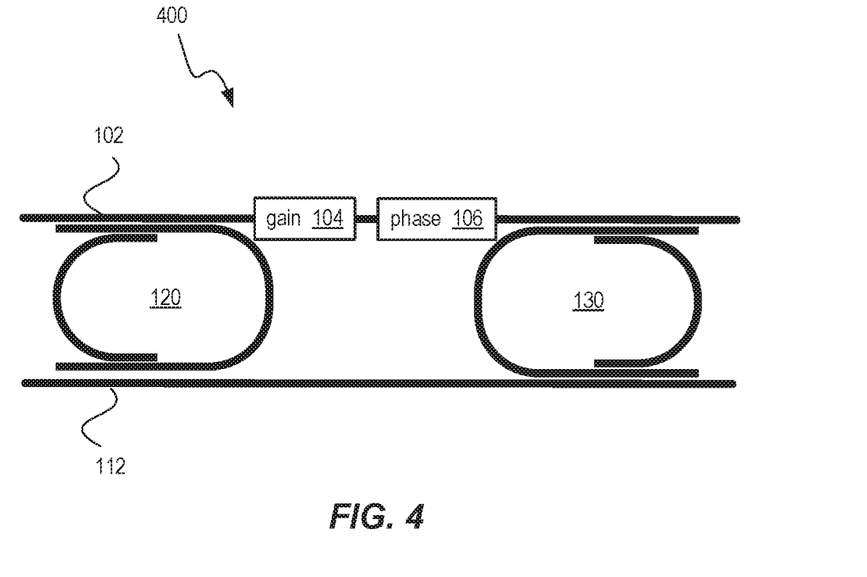
FIG. 4 illustrates a laser diode with MEMS/NEMS broken racetrack ring resonators on both sides, according to some embodiments.

FIGS. 4-7 illustrate laser diodes 400-700, according to some embodiments, where single racetrack ring or coupled racetrack ring structures can be inserted on both sides of gain and phase section 104, 106. These similar ring structures may have different circumferences that work as a wavelength filter and/or a laser reflector. FIG. 4 shows a double-sided Vernier broken racetrack ring laser diode 400, which has two racetrack rings 120, 130 with different circumferences on each side, coupled to bus optical waveguides 102, 112. In one embodiment, the first and second broken racetrack ring resonators 120, 130 are coupled to optical waveguide 102 on opposite sides of gain and phase section 104, 106. The first and second racetrack rings may be oriented towards each other, in the same direction, or away from each other along optical waveguide 102. In some embodiments, the tuning arrangement is configured to move respective portions 122, 132 of the first and second racetrack rings 120, 130 towards each other, in the same direction, or in the opposite direction.

Figure 5:
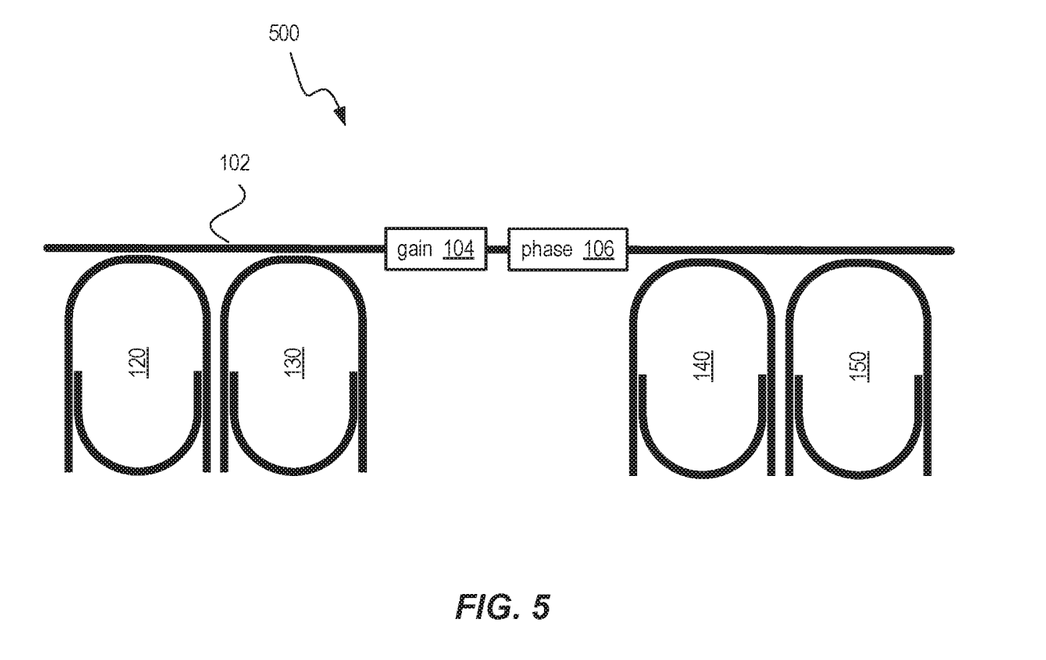
FIG. 5 illustrates another laser diode with MEMS/NEMS broken racetrack ring resonators on both sides, according to some embodiments.

In FIG. 5, two optically-coupled broken racetrack ring resonators arrays (120/130 and 140/150) are placed on both sides for laser diode 500. The resonance wavelengths from resonator arrays are slightly different. Also, the two bus waveguides 102, 112 can be reduced to single optical waveguide 102 for simplified structures. In one embodiment, the first and second broken racetrack ring resonators 120, 130 are optically coupled together and coupled to optical waveguide 102 on a first side of the gain and phase section 104, 106, where a third one 140 and a fourth one 150 of the broken racetrack ring resonators are optically coupled together and coupled to optical waveguide 102 on an opposite side of the gain and phase section 104, 106. In a further embodiment, the first, second, third and fourth ones 120-150 may be oriented in the same direction towards optical waveguide 102, and the tuning arrangement may be configured to move respective portions of the first, second, third and fourth ones 120-150 in the same direction or in opposite directions.

Figure 6:
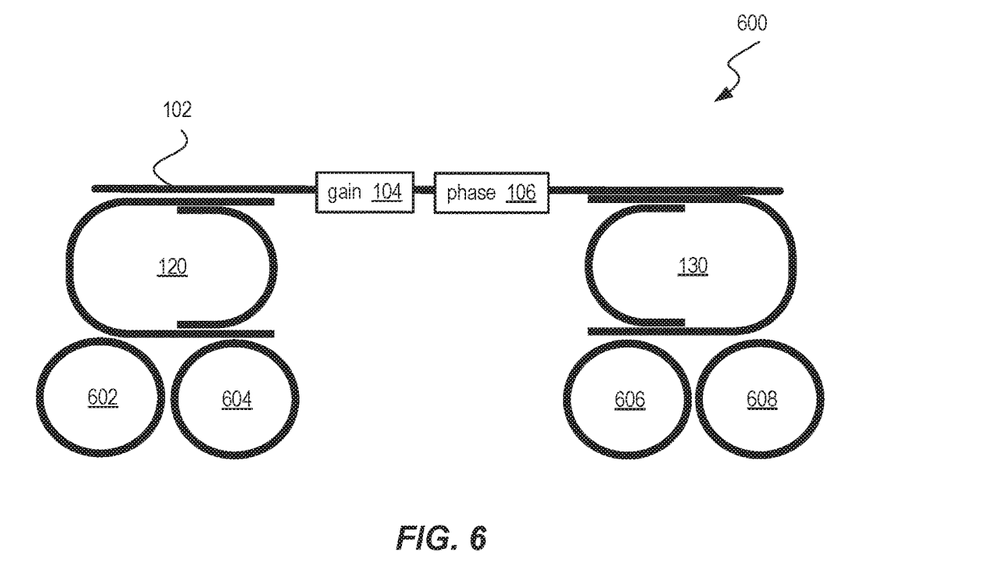
FIG. 6 illustrates another laser diode with MEMS/NEMS broken racetrack ring resonators on both sides, according to some embodiments.

FIG. 6 illustrates an optical system where first and second ones of the broken racetrack ring resonators 120, 130 for laser diode 600 are coupled to optical waveguide 102 on opposite sides of a gain and phase section 104, 106. The racetrack rings 120, 130 may be oriented towards each other or away from each other along optical waveguide 102. The tuning arrangement is configured to move respective portions of the first and second ones 120, 130 towards each other, in the same direction, or in opposite directions away from each other. As shown in FIG. 6, the optical system may also include one or more ring resonators 602, 604, 606 and 608 coupled to each of the first and second ones 120, 130 in reflector and filter configurations. A circular array of an odd number (2N+1, N>1) of coupled rings may form a lossless reflector. For example, broken racetrack ring resonator 120 and ring resonators 602 and 604 may be coupled together in a circular array to form a reflector. The total number of ring resonators for this side is three, an odd number. The total number of ring resonators for each side may be another odd number, or 2N+1, where N is greater than 1.

Figure 7:
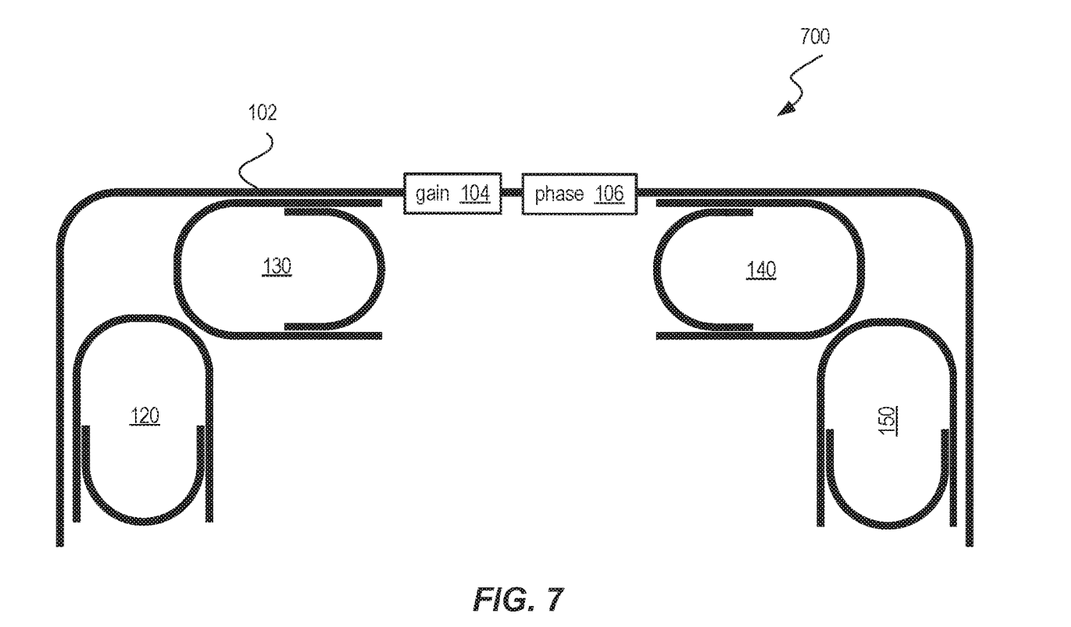
FIG. 7 illustrates another laser diode with MEMS/NEMS broken racetrack ring resonators on both sides, according to some embodiments.

In another example, a circular array may be formed from an even number (2N, N>0) of broken racetrack ring resonators and other ring resonators. The even number of ring resonators in a perimeter can be described as 2N, where N is greater than 0. FIG. 7 shows an example of an even number of ring resonators 120, 130 (or 140, 150) on each side of the phase and gain section 104, 106 for laser diode 700. In this embodiment, the first and fourth ones 120, 150 may be oriented in the same direction towards optical waveguide 102. The second and third ones 130, 140 may be oriented towards each other or away from each other along optical waveguide 102, and the tuning arrangement may be configured to move respective portions of the first and fourth ones 120, 150 in the same direction or in opposite directions and respective portions of the second and third ones 130, 140 in the same direction or in opposite directions.

Figure 8:
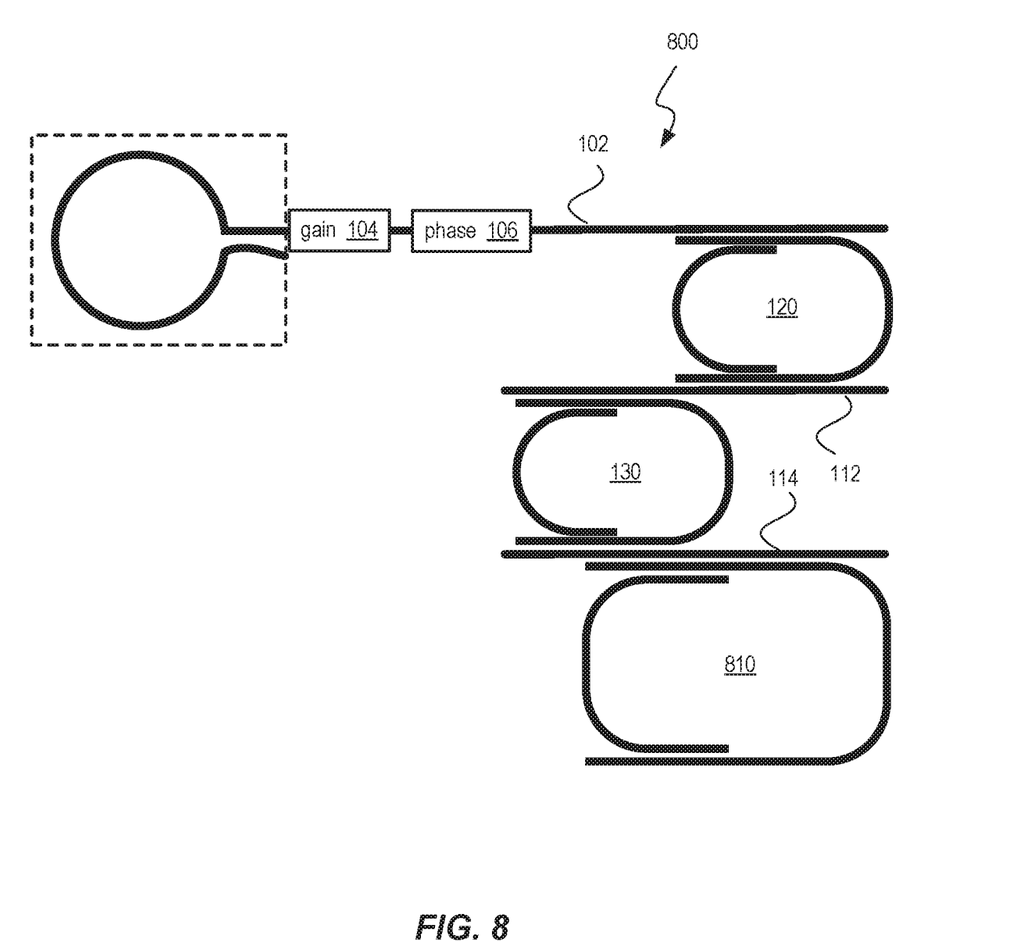
FIG. 8 illustrates a laser diode with an external broken racetrack ring reflector, according to some embodiments.

In order to narrow the linewidth of these tunable laser diodes, another external broken racetrack ring resonator reflector can be integrated with the laser diode structures, as shown for the laser diode 800 in FIG. 8. FIG. 8, according to some embodiments, shows the calculated spectrum and reflected laser light from external racetrack ring 810 is filtered by racetrack rings 120 and 130 based on a Vernier effect. The length of this external broken racetrack ring resonator 810 may be much larger than racetrack rings 120 and 130 in a Vernier tuning process. External broken racetrack ring resonator 810 can be easily integrated with other waveguide structures on the same chip. The racetrack rings 120, 130, 810 may or may not be optically coupled together with bus waveguides 112 and 114.

The broken racetrack ring resonators and phase region can be microfabricated on a silicon substrate and integrated with gain material using a standard heterogenous active material/silicon process. These broken racetrack ring resonator structures and the phase region can also be fabricated using the same material as the gain. In some cases, laser diodes may be directly and/or hybrid integrated (which means readily processed III-V laser diodes or gain material optically connected to silicon photonics circuits), on a silicon substrate with other laser diodes. The other laser diodes may be designed in accordance with standards by organizations such as the European Photonics Industry Consortium (EPIC).

Figure 9:
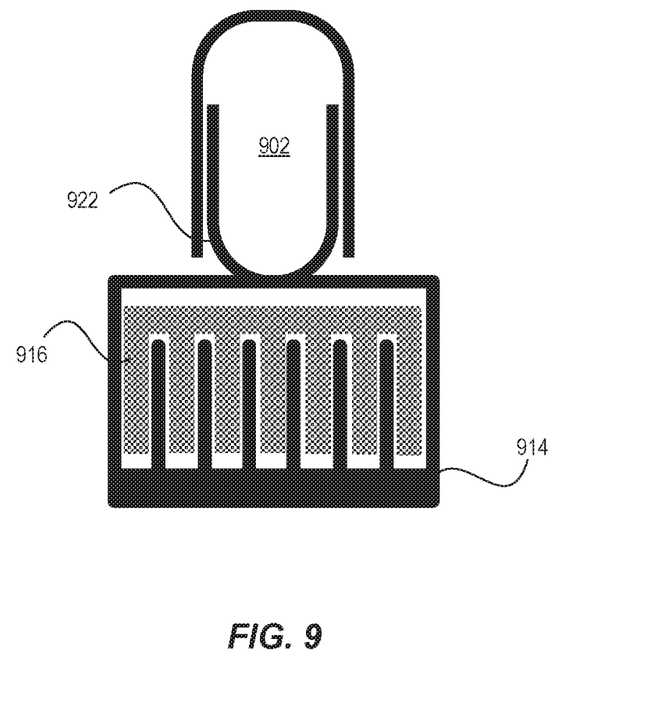
FIG. 9 illustrates a broken racetrack ring resonator with a portion that is movable by a comb actuator, according to some embodiments.
Figure 10:
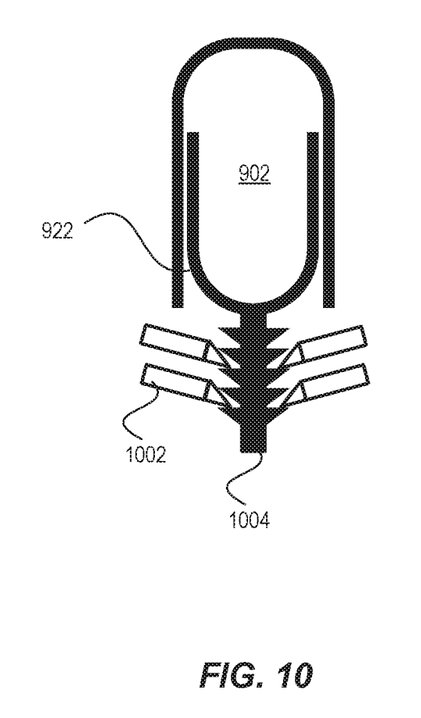
FIG. 10 illustrates a broken racetrack ring resonator with a portion that is movable by inchworm actuators, according to some embodiments.
Figure 11:
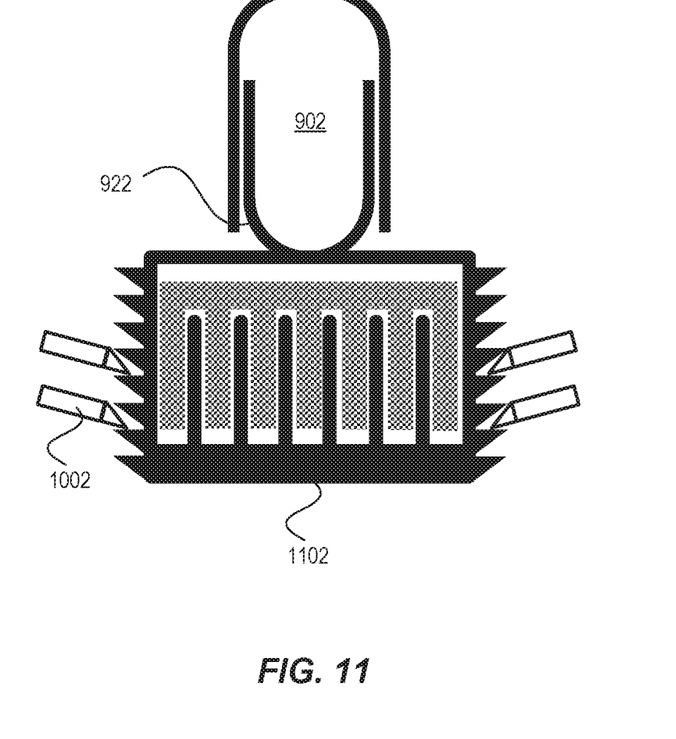
FIG. 11 illustrates a broken racetrack ring resonator with a portion that is movable by a combination of a comb actuator and inchworm actuators, according to some embodiments.

Different MEMS/NEMS components may be used to move a portion of a broken racetrack ring resonator (e.g., a half arm of the broken racetrack), according to some embodiments. Such components may include a comb actuator. FIG. 9 shows broken racetrack ring resonator 902 with a comb actuator 916 that is movable with respect to actuator portion 914, which is attached to racetrack ring portion 922. Movement between comb actuator 916 and actuator portion 914 adjust the circumference of broken racetrack ring resonator 902. FIG. 10 shows an example using inchworm actuators 102 on actuator portion 1004. FIG. 11 shows an example integration of inchworm 1002 and comb 1102 actuators. Other embodiments can include various combinations of the same type of actuators or different types of actuators. With certain combinations of actuators, the movement of a portion of a racetrack ring can be rather small, with a reduced amount of actuating force.

The actuating can be based on electrostatic, thermal, magnetic, or optical forces. Various materials (e.g., metal, III-V material, silicon and organic film) can be applied to use various actuating principles. The actuator circuits can be integrated with broken racetrack ring resonator laser diodes using monolithic integration, 3D stacked integration or hybrid integration on the same substrate. The actuator can directly move portions of the broken racetrack rings or use micro or nano cantilevers to move the broken racetrack ring portions. The optical system may be on a single chip and may be silicon based. The optical system may also be integrated on a single chip with a photodiode that is configured to monitor emitted light and tune the optical system using a feedback loop.

Other tuning methods (e.g., thermal or carrier injection and depletion) that change the resonator waveguide refractive index can still be applied in addition to these MEMS/NEMS actuated flexible broken racetrack ring resonators, to further optimize the laser diodes tunability at a lower cost.

Notably, modifications and other embodiments of the disclosed invention(s) will come to mind to one skilled in the art having the benefit of the teachings presented in the foregoing descriptions and the associated drawings. Therefore, it is to be understood that the invention(s) is/are not to be limited to the specific embodiments disclosed and that modifications and other embodiments are intended to be included within the scope of this disclosure. Although specific terms may be employed herein, they are used in a generic and descriptive sense only and not for purposes of limitation.

What is claimed is:

1. An optical system, comprising:
   a laser diode apparatus configured to emit optical signals, the laser diode apparatus comprising:
   at least two size-switchable broken racetrack ring resonators optically coupled to an optical waveguide, wherein each broken racetrack ring resonator has an outer portion and an inner portion and is configured to exhibit a resonant wavelength; and
   a tuning arrangement associated with the broken racetrack ring resonators, wherein the tuning arrangement comprises:
   a micro electro-mechanical system (MEMS) or nano electro-mechanical system (NEMS) actuator mechanically coupled to a first portion of a first one of the broken racetrack ring resonators and configured to mechanically move the first portion so as to change the resonant wavelength of the first one of the broken racetrack ring resonators;
   wherein the first one and a second one of the broken racetrack ring resonators are coupled to the optical waveguide on opposite sides of a gain and phase section, and the tuning arrangement is configured to move respective portions of the first and second ones of the broken racetrack ring resonators in the same direction or in opposite directions.

2. The optical system of claim 1, wherein each broken racetrack ring resonator has a periphery with a different circumference, and wherein the broken racetrack ring resonators and the tuning arrangement are configured to mechanically tune the optical system so as to enlarge the wavelength tunable range based on a Vernier effect.

3. The optical system of claim 1, wherein the tuning arrangement is configured to use the actuator to adjust a circumference of the first one of the broken racetrack ring resonators.

4. The optical system of claim 1, wherein the tuning arrangement is configured to directly move the first portion of the first one of the broken racetrack ring resonators.

5. The optical system of claim 1, wherein the tuning arrangement is configured to move the first portion of the first one of the broken racetrack ring resonators through a micro cantilever or a nano cantilever.

6. The optical system of claim 1, further comprising one or more ring resonators coupled to each of the first and second ones, forming an array on each side of the gain and phase section.

7. The optical system of claim 6, wherein the number of ring resonators for each side is 2N+1, where N is greater than 1.

8. The optical system of claim 6, wherein the number of ring resonators for each side is 2N, where N is greater than 0.

9. The optical system of claim 1, wherein the first one and a second one of the broken racetrack ring resonators are coupled together and coupled to the optical waveguide on a first side of a gain and phase section, wherein a third one and a fourth one of the broken racetrack ring resonators are coupled together and coupled to the optical waveguide on an opposite side of the gain and phase section.

10. The optical system of claim 9, wherein the tuning arrangement is configured to move respective portions of the first, second, third and fourth ones in the same direction or in opposite directions.

11. The optical system of claim 1, wherein the first one of the broken racetrack ring resonators is coupled to the optical waveguide and oriented along the optical waveguide, wherein a second one of the broken racetrack ring resonators is coupled to the first one, and wherein a third, larger external broken racetrack ring resonator is coupled to the second one, and wherein the tuning arrangement is configured to move respective portions of each of the first, second and third broken racetrack ring resonators.

12. The optical system of claim 1, wherein the actuator is integrated with other components of the optical system on a single substrate using one of monolithic integration, 3D stacked integration and hybrid integration.

13. The optical system of claim 1, wherein the actuator comprises an inchworm actuator and/or a comb actuator.

14. The optical system of claim 1, wherein the optical system is on a single chip.

15. The optical system of claim 14, wherein the optical system is integrated on the single chip with a photodiode that is configured to monitor emitted light and tune the optical system using a feedback loop.

16. The optical system of claim 1, wherein the optical system comprises a silicon-based system.

* * * * *